United States Patent
Chang et al.

(10) Patent No.: US 11,239,607 B2
(45) Date of Patent: Feb. 1, 2022

(54) FASTENING DEVICE FOR EXPANSION CARDS

(71) Applicant: INNODISK CORPORATION, New Taipei (TW)

(72) Inventors: Shuang-Te Chang, New Taipei (TW); Ting-Yun Lin, New Taipei (TW); Cheng-Wei Lee, New Taipei (TW); Rei Yeh, New Taipei (TW); Chung-Yu Chuang, New Taipei (TW)

(73) Assignee: Innodisk Corporation, New Taipei (TW)

( * ) Notice: Subject to any disclaimer, the term of this patent is extended or adjusted under 35 U.S.C. 154(b) by 7 days.

(21) Appl. No.: 16/851,296

(22) Filed: Apr. 17, 2020

(65) Prior Publication Data

US 2021/0135401 A1    May 6, 2021

(30) Foreign Application Priority Data

Oct. 30, 2019 (TW) .................. 108139245

(51) Int. Cl.
*H01R 13/62* (2006.01)
*H01R 13/639* (2006.01)
*G06F 1/18* (2006.01)
*H01R 12/70* (2011.01)
*H01R 12/73* (2011.01)

(52) U.S. Cl.
CPC ........... *H01R 13/639* (2013.01); *G06F 1/185* (2013.01); *H01R 12/7058* (2013.01); *H01R 12/737* (2013.01)

(58) Field of Classification Search
CPC .......................... H01R 13/639; H01R 12/7058
USPC ................................... 328/328, 327
See application file for complete search history.

(56) References Cited

U.S. PATENT DOCUMENTS

| | | | | |
|---|---|---|---|---|
| 5,726,865 | A * | 3/1998 | Webb | H05K 7/1405 361/801 |
| 6,062,894 | A * | 5/2000 | Barringer | H05K 7/1415 439/377 |
| 6,394,831 | B1 * | 5/2002 | Bowers | H05K 7/1431 439/327 |
| 6,396,685 | B1 * | 5/2002 | Chien | G06F 1/184 312/223.2 |
| 6,545,877 | B1 * | 4/2003 | Agha | H05K 7/1417 361/759 |
| 6,589,059 | B2 * | 7/2003 | Perino | H05K 7/1431 439/73 |

(Continued)

*Primary Examiner* — Neil Abrams
(74) *Attorney, Agent, or Firm* — Rosenberg, Klein & Lee

(57) ABSTRACT

A fastening device for expansion cards that is capable of connecting to a slot on a normal motherboard and fastening an expansion card in the slot is disclosed. The fastening device includes a top pressing unit and two side fastening units, wherein the two side fastening units are connected to two ends of the top pressing unit, respectively, and each side fastening unit is provided with an opening. When two clip units disposed on the two ends of the slot pass through the openings of the two side fixing units respectively, the top pressing unit presses the top edge of the expansion card inserted into the slot and the two side fastening units respectively press and fasten the two clip units so as to restrain the clip units from unlocking and to prevent the expansion card from becoming loose in the slot.

9 Claims, 10 Drawing Sheets

(56) References Cited

U.S. PATENT DOCUMENTS

| | | | | |
|---|---|---|---|---|
| 6,611,058 B2* | 8/2003 | Kinsman | ............... | H05K 3/301 |
| | | | | 257/727 |
| 6,885,565 B2* | 4/2005 | Shi | ......................... | G06F 1/184 |
| | | | | 361/732 |
| 7,371,097 B1* | 5/2008 | Pennypacker | ..... | H01R 13/6275 |
| | | | | 439/327 |
| 7,933,129 B2* | 4/2011 | Chen | ....................... | G06F 1/185 |
| | | | | 361/801 |
| 8,075,330 B1* | 12/2011 | Deng | ................ | H01R 12/7005 |
| | | | | 439/328 |
| 8,113,863 B2* | 2/2012 | Vrenna | ................ | H01R 12/721 |
| | | | | 439/327 |
| 8,422,216 B2* | 4/2013 | Liang | ..................... | G06F 1/183 |
| | | | | 361/679.31 |
| 8,559,187 B2* | 10/2013 | Peng | ................... | H05K 7/1431 |
| | | | | 361/801 |
| 8,771,001 B2* | 7/2014 | Li | ....................... | H01R 13/639 |
| | | | | 439/328 |
| 10,193,248 B2* | 1/2019 | Shaw | ................ | H01R 12/7029 |
| 10,651,576 B2* | 5/2020 | Chen | ................ | H01R 13/6273 |
| 10,734,756 B2* | 8/2020 | Shaw | ................... | H01R 43/205 |
| 2021/0135401 A1* | 5/2021 | Chang | ................ | H05K 7/1405 |

\* cited by examiner

FASTENING DEVICE FOR EXPANSION CARDS

REFERENCE TO RELATED APPLICATIONS

This non-provisional application claims priority claim under 35 U.S.C. § 119(a) on Taiwan Patent Application No. 108139245 filed Oct. 30, 2019 the entire contents of which are incorporated herein by reference.

TECHNICAL FIELD

The present disclosure relates to a fastening device for expansion cards, more particularly, to a fastening device that restrains a clip unit from unlocking and prevents an expansion card from becoming loose in a slot.

BACKGROUND

FIG. 1 is a schematic diagram of a conventional memory card and slot assembly. In general, at least one slot 13 is provided on a normal computer motherboard for an interface card or a memory card 11 to be inserted into the slot 13. At the two ends of the slot 13, there is one clip unit 15 disposed at each end for clipping the memory card 11 inserted into the slot 13 to prevent the memory card from falling off the slot 13.

Through the conventional assembly of the slot 13 and the clip units 15, the memory card 11 is secured in the slot 13, however, vibrations from moving the computer often make the connection between the memory card 11 and the slot 13 become loose and thus the computer operation is affected.

SUMMARY

An object of the present disclosure is to provide a fastening device for expansion cards that is mainly used to further strengthen the connection between an expansion card, like a memory card or an interface card, and a slot, by which the unlocking of a clip unit due to vibrations that may cause the expansion card to loosen from the slot is prevented.

An object of the present disclosure is to provide a fastening device for expansion cards that is able to connect to a slot provided on a motherboard of a general computer without having to alter the format/configuration/size of the slot on the motherboard. After being connected to the slot, the fastening device presses and fastens the clip units at the two ends of the slot to restrain the clip units from unlocking.

An object of the present disclosure is to provide a fastening device for expansion cards that is able to connect to a slot on a normal computer motherboard without having to alter the format of the slot on the motherboard. After being connected to the slot, the fastening device presses on the expansion card that is inserted in the slot to prevent loosening of the expansion card from the slot.

An object of the present disclosure is to provide a fastening device for expansion cards that includes a first top pressing unit and a second top pressing unit, wherein the first top pressing unit and the second top pressing unit are connected to each other at one end and are each connected to a side fastening unit at the other end for pressing and fastening a clip unit. Moreover, the first top pressing unit and the second top pressing unit can move relative to each other to adjust a distance between the two side fastening units such that the fastening device for expansion cards is able to connect to slots of different sizes and lengths.

An object of the present disclosure is to provide a fastening device for fastening an expansion card in a slot, wherein the slot includes a clip unit disposed at each of its two ends for clipping two side edges of the expansion card. The fastening device includes a top pressing unit and two side fastening units respectively connected to two ends of the top pressing unit, wherein the side fastening unit includes an opening and the two clip units at the two ends of the slot pass through the openings of the two side fastening units respectively and are respectively pressed and fastened thereby.

Another object of the present disclosure is to provide a fastening device for fastening an expansion card in a slot, wherein the slot has a base and two side portions connected respectively to two ends of the base, and each of the two side portions has an outer surface and an inner surface and includes a clip unit disposed on the outer surface for clipping two side edges of the expansion card inserted into the slot. The fastening device includes a main body and an elastic cushion. The main body includes a fastening board, two connect boards, and two protrusions, wherein the two connect boards are connected to two opposite side edges of the fastening board respectively and an accommodating space is formed between the fastening board and the two connect boards. The two protrusions are connected to the two connect boards respectively, wherein each of the connect boards is connected to the fastening board at one side edge and to the protrusion at the other side edge, and the two protrusions face each other and protrude from the connect boards in opposite directions. The elastic cushion is disposed in the accommodating space of the main body, wherein the main body is sleeved over the side portion of the slot and the clip unit for the side portion and the clip unit to be placed inside the accommodating space and for the protrusions to engage the inner surface of the side portion, and the elastic cushion fastens and compresses the clip unit.

In one embodiment of the present disclosure, the top pressing unit includes a first top pressing unit and a second top pressing unit, wherein one end of the first top pressing unit is connected to one end of the second top pressing unit, and the other ends of the first top pressing unit and the second top pressing unit are connected to the two side fastening units respectively.

BRIEF DESCRIPTION OF THE DRAWINGS

The structure as well as preferred modes of use, further objects, and advantages of this present disclosure will be best understood by referring to the following detailed description of some illustrative embodiments in conjunction with the accompanying drawings, in which.

DETAILED DESCRIPTION OF THE PREFERRED EMBODIMENTS

Figure 1:
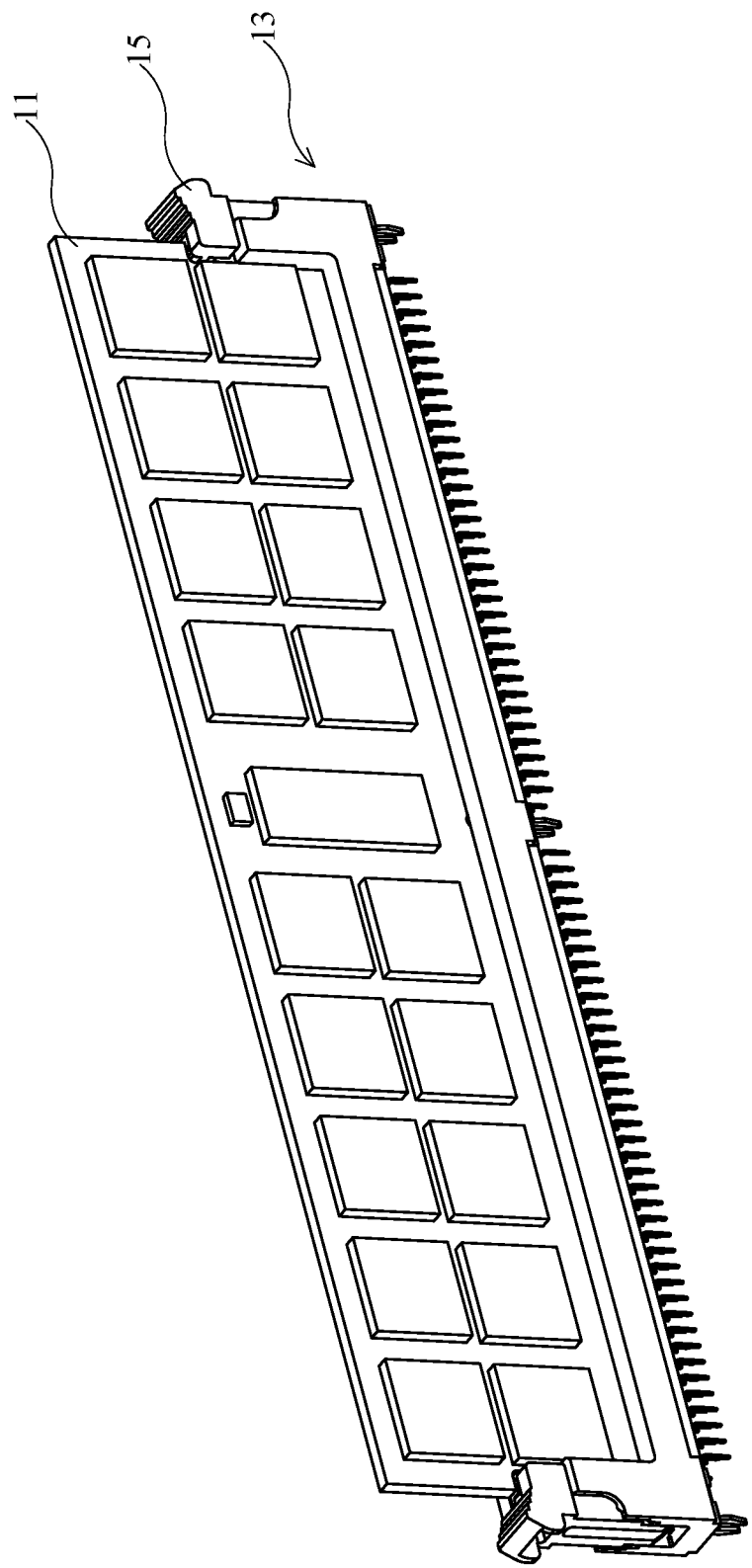
FIG. 1 is a schematic diagram of a conventional memory card and slot assembly.
Figure 2:
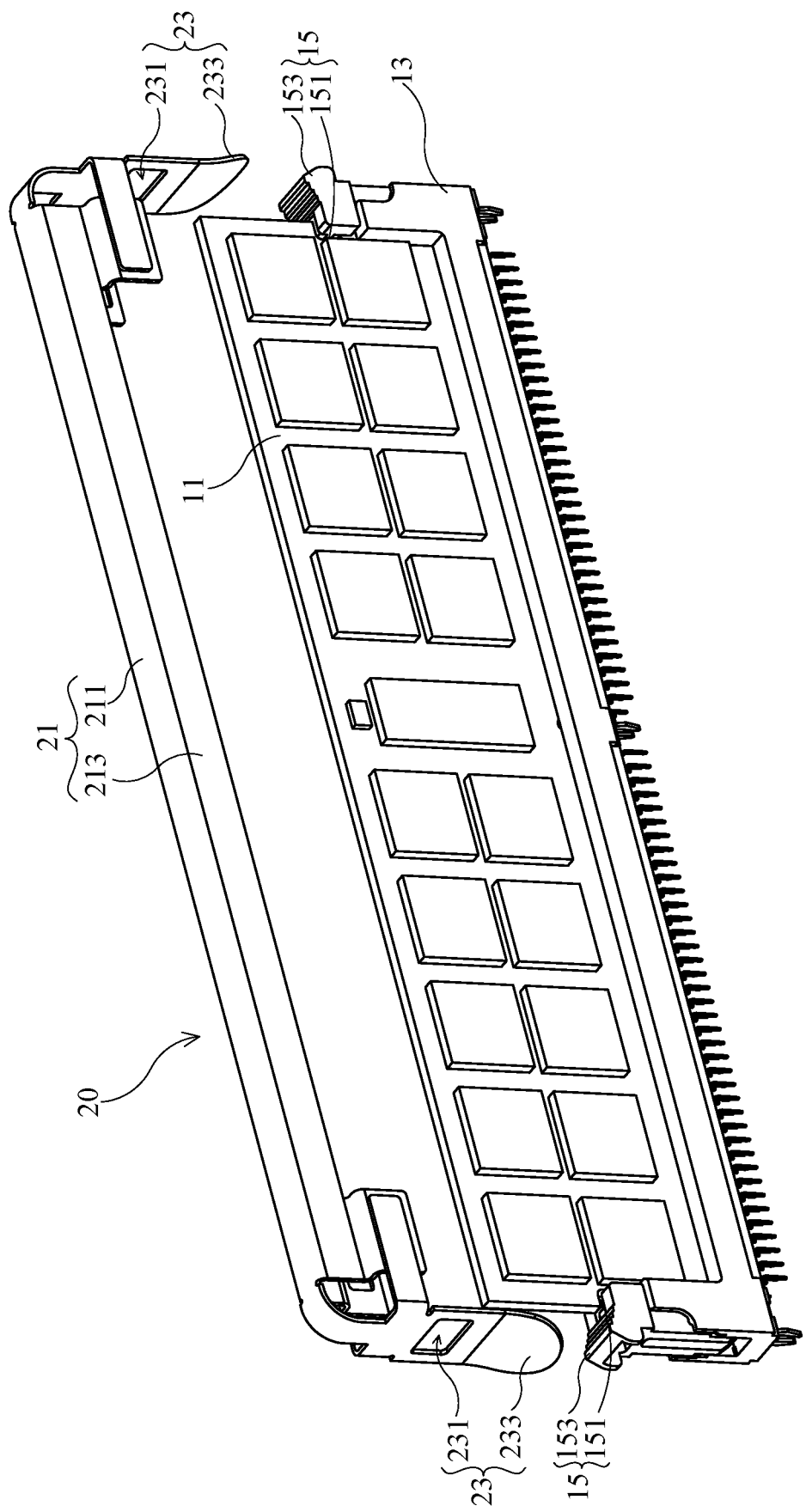
FIG. 2 is an exploded view of a fastening device for expansion cards with a memory card in a slot according to an embodiment of the present disclosure.
Figure 3:
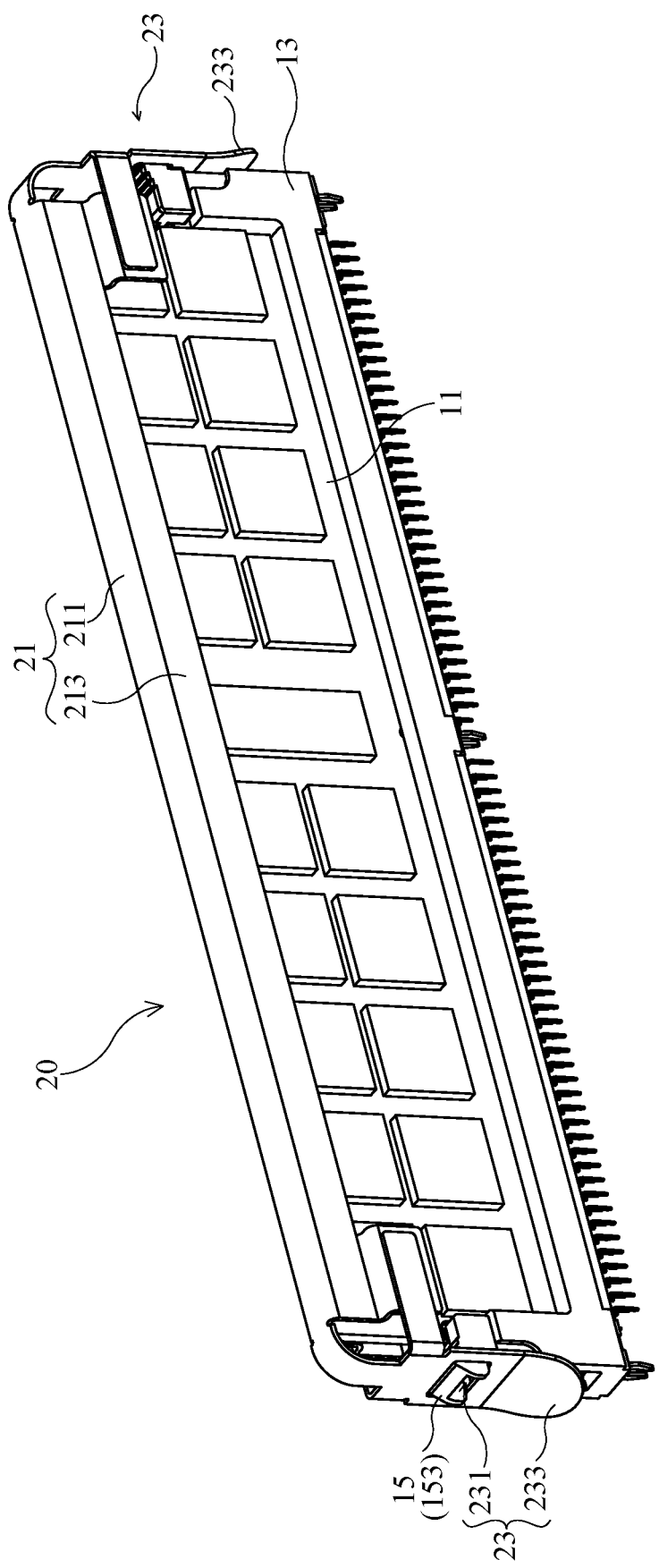
FIG. 3 is a schematic diagram of a fastening device for expansion cards assembled to a memory card and a slot according to an embodiment of the present disclosure.

Referring to FIGS. 2 and 3, a fastening device 20 for expansion cards according to one embodiment of the present disclosure is used to fasten an expansion card 11, like an interface card or a memory card, in a slot 13, and includes a top pressing unit 21 and two side fastening units 23, wherein the two side fastening units 23 are respectively connected to two ends of the top pressing unit 21. For example, the two side fastening units 23 are approximately perpendicular to the top pressing unit 21, and thus the fastening device 20 is approximately U-shaped.

Figure 8:
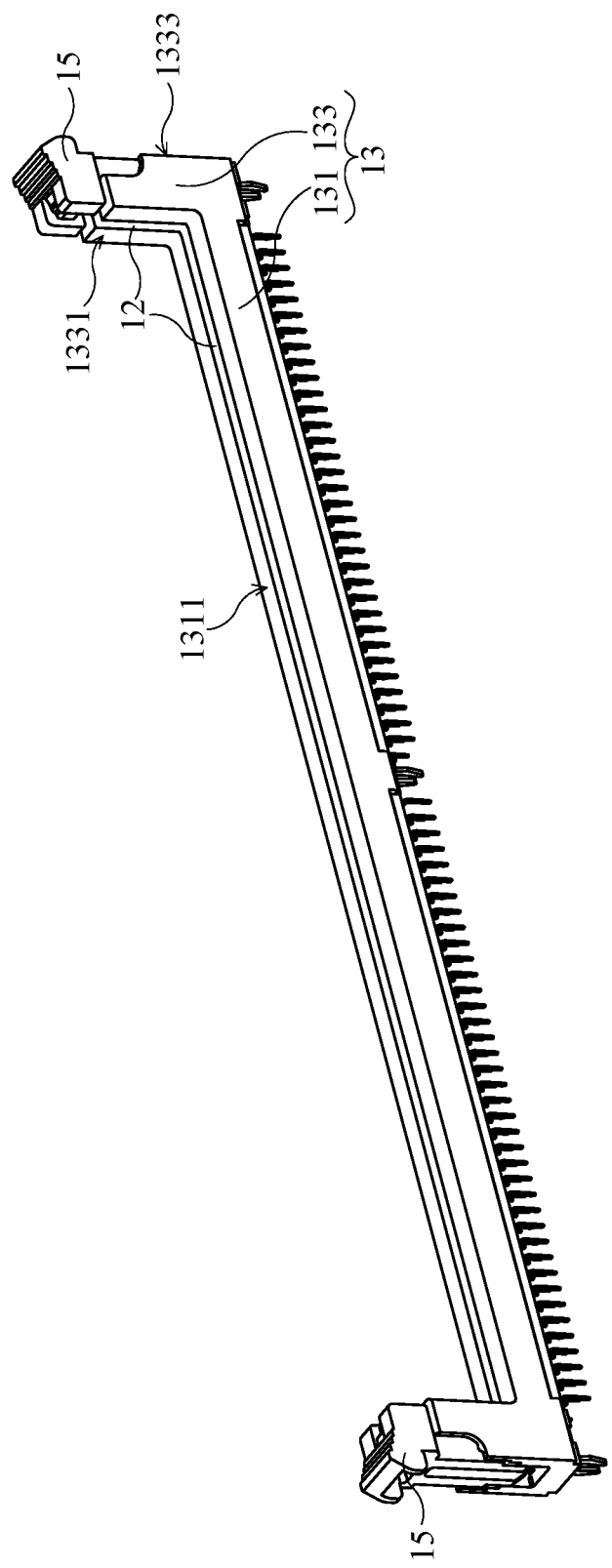
FIG. 8 is a schematic diagram of a slot.

The expansion card 11 is often a board-like element, and the slot 13 has disposed therein a trench-like accommodation groove 12 as shown in FIG. 8. The expansion card 11 is inserted into the accommodation groove 12 of the slot 13 for connecting the connector of the expansion card 11 with the connector in the accommodation groove 12 of the slot 13. For example, the expansion card 11 is an SDRAM and the slot 13 is an SDRAM slot.

A clip unit 15 is disposed at each of the two ends of the slot 13 for clipping the two side edges of the expansion card 11 inserted into the slot 13. In specific, one end of the clip unit 15 is connected to the slot 13 through a coupling shaft, such that the clip unit 15 is rotatable relative to the slot 13.

Moreover, a clip portion 151 and a press portion 153 are disposed at the other end of the clip unit 15, wherein the clip portion 151 and the press portion 153 are respectively positioned on the inner side and the outer side of the clip unit 15 and protrude from the clip unit 15 in different directions. The clip portion 151 faces the expansion card 11 of the slot 13 and engages with a recess on the side edge of the expansion card 11 to secure the expansion card 11 in the slot 13.

The press portion 153 protrudes in a direction opposite to the clip portion 151 and so it is convenient for the user to operate the clip unit 15 through the press portion 153. In practice, the user pushes the press portion 153 of the clip unit 15 towards the expansion card 11 to engage the clip portion 151 of the clip unit 15 with the recess of the expansion card 11 and secures the expansion card 11 in the slot 13. In addition, the user presses the press portion 153 of the clip unit 15 downwards or outwards to release the clip portion 151 of the clip unit 15 from the recess of the expansion card 11 and takes out the expansion card 11 from the slot 13.

The fastening device 20 for expansion cards is capable of further strengthening the connection between the expansion card 11 and the slot 13 and effectively preventing the loosening of the expansion card 11 in the slot 13 due to vibrations. Furthermore, the fastening device 20 is able to connect to the slot provided on a motherboard of general computers, and therefore the prevention of the loosening of the expansion card 11 in the slot 13 is achieved without having to alter the format of the slot 13 on the motherboard.

In one embodiment, the side fastening unit 23 of the fastening device 20 includes an opening 231, wherein the two clip units 15 at the two ends of the slot 13 respectively pass through the opening 231 of the two side fastening units 23 to affix the fastening device 20 to the slot 13 as shown in FIG. 3.

After the expansion card 11 is disposed in the slot 13, the fastening device 20 is then disposed on the slot 13. Particularly, the opening 231 of the side fastening unit 23 is sleeved over or engaged with the press portion 153 of the clip unit 15 such that the top pressing unit 21 presses, in the direction of the slot 13, a top edge of the expansion card 11 disposed on the slot 13. Hence, the connection between the expansion card 11 and the slot 13 is strengthened and the loosening of the expansion card 11 in the slot 13 due to vibrations is prevented.

The two side fastening units 23 further press and hold the two clip units 15 at the two ends of the slot 13 in place to prevent the unlocking of the clip units 15 which may lead to the expansion card 11 becoming loose in the slot 13.

In one embodiment, the top pressing unit 21 includes a top board 211 and two side boards 213, wherein the top board 211 and the side boards 213 are rectangular, and the two side boards 213 are connected to two longer side edges of the top board 211 so that the top pressing unit 21 is approximately U-shaped in cross-section. Moreover, one end of the side fastening unit 23 is bent in a direction away from the slot 13 and forms a bend 233, which is convenient for user to connect the fastening device 20 to the slot 13. Also, the user can pull the two bends 233 away from the slot 13 to disengage the press portions 153 of the clip units 15 from the openings 231 of the side fastening units 23 and take the fastening device 20 off the slot 13 as shown in FIG. 2.

Figure 4:
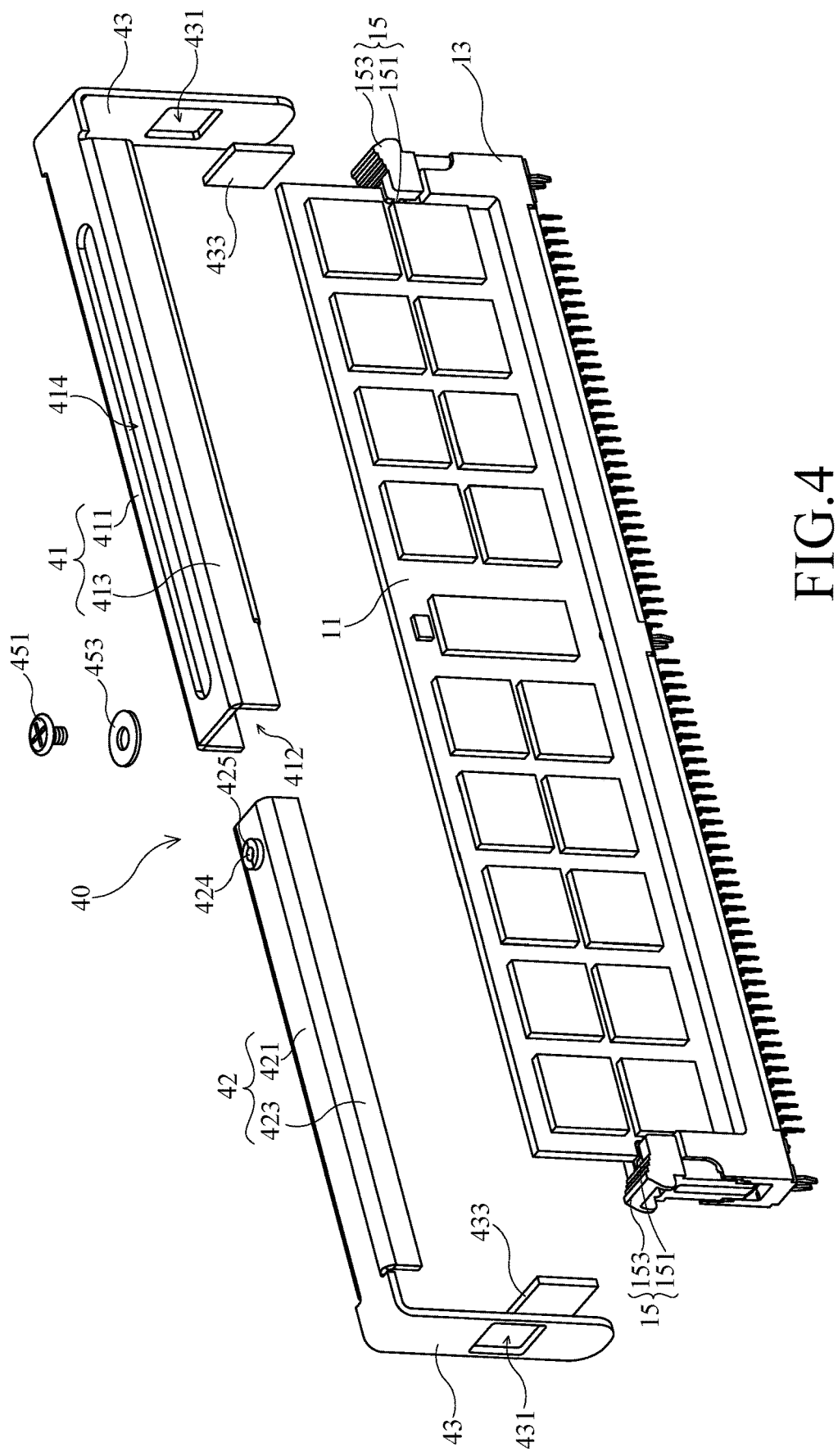
FIG. 4 is an exploded view of a fastening device for expansion cards with a memory card in a slot according to another embodiment of the present disclosure.
Figure 5:
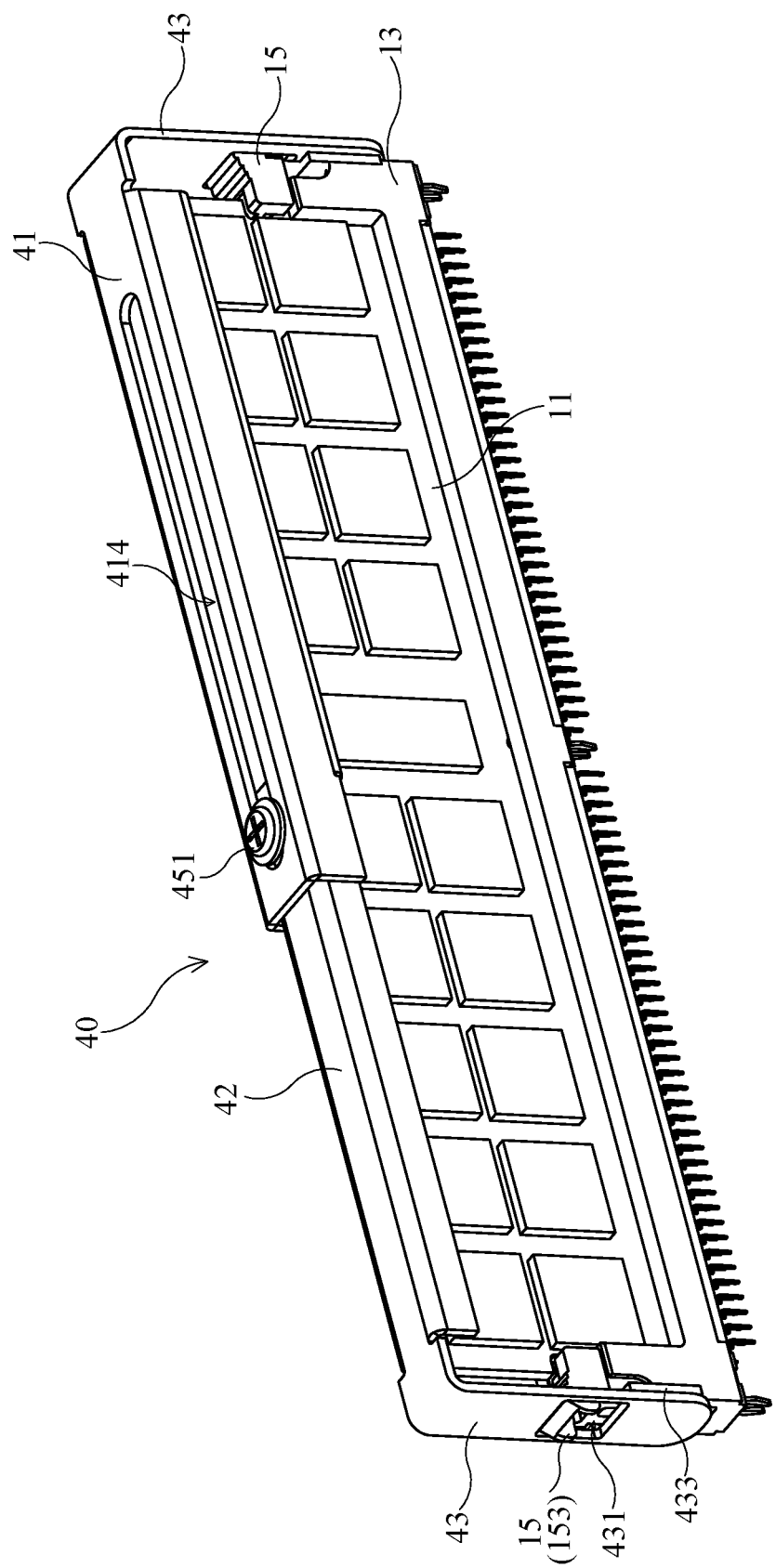
FIG. 5 is a schematic diagram of a fastening device for expansion cards assembled to a memory card and a slot according to another embodiment of the present disclosure.

Referring to FIGS. 4 and 5, a fastening device 40 for expansion cards according to another embodiment of the present disclosure includes a first top pressing unit 41, a second top pressing unit 42, and two side fastening units 43, wherein one end of the first top pressing unit 41 is connected to one end of the second top pressing unit 42. The other end of the first top pressing unit 41 is connected to one of the two side fastening units 43 and the other end of the second top pressing unit 42 is connected to the other one of the two side fastening units 43.

In one embodiment, the first top pressing unit 41 has an accommodating space 412 and the second top pressing unit 42 can be inserted into the accommodating space 412 through one end of the first top pressing unit 41. The second top pressing unit 42 is movable in the accommodating space 412 relative to the first top pressing unit 41 to adjust a distance between the two side fastening units 43 that are connected to the first top pressing unit 41 and the second top pressing unit 42, and thus the fastening device 40 is capable of connecting to slots 13 of different sizes and lengths and fastening expansion cards 11 of different sizes and lengths in the slot 13.

The first top pressing unit 41 includes a top board 411 and two side boards 413, wherein the top board 411 and the two side boards 413 are rectangular and the two side boards 413 are respectively connected to two long side edges of the top boards 411 so that the first top pressing unit 41 is approximately U-shaped in cross-section. The accommodating space 412 is formed between the top board 411 and the two side boards 413. Furthermore, the second top pressing unit 42 includes a top board 421 and two side boards 423 and has a cross-section or shape similar to that of the first top pressing unit 41.

A connect groove 414 is disposed on the top board 411 of the first top pressing unit 41, wherein the connect groove 414 is strip-shaped, penetrates the upper and lower surfaces of the top board 411 of the first top pressing unit 41, and in fluid communication with the accommodating space 412. The connect groove 414 is disposed along the long side of the top board 411.

A connect hole 424 is disposed on the top board 421 of the second top pressing unit 42, and when the first top pressing unit 41 and the second top pressing unit 42 move relative to one another, the connect hole 424 is displaced along the connect groove 414. In addition, a fastening screw 451 can be used to connect the first top pressing unit 41 and the second top pressing unit 42 and fix the distance between the two side fastening units 43 by passing the fastening screw 451 through the connect groove 414 of the first top pressing unit 41 and fastening the fastening screw 451 to the connect hole 424 of the second top pressing unit 42. For example, screw threads may be disposed in the connect hole 424 and the fastening screw 451 is screwed into the screw threads of the connect hole 424.

In one embodiment, a washer 453 is sleeved over the fastening screw 451 to be disposed between the fastening screw 451 and the top board 411 of the first top pressing unit 41, thereby further securing the connection between the first top pressing unit 41 and the second top pressing unit 42 and preventing changes in the distance between the two side fastening units 43.

Furthermore, an annular protrusion 425 is disposed around the connect hole 424 of the second top pressing unit 42, wherein the diameter or the width of the annular protrusion 425 is approximately the same as the width of the connect groove 414 of the first top pressing unit 41 so that the annular protrusion 425 is fitted in the connect groove 414 and is able to move or be displaced along the connect groove 414. By implementing the annular protrusion 425, the stability and accuracy of the displacement between the first top pressing unit 41 and the second top pressing unit 42 is enhanced.

On the side fastening unit 43, an opening 431 is disposed, wherein the clip units 15 and/or the press portions 153 at the two ends of the slot 13 pass through the openings 431 of the two side fastening units 43, respectively, to affix the fastening device 40 to the slot 13 as shown in FIG. 5. Moreover, the two side fastening units 43 further hold the clip units 15 at the two sides of the slot 13 in place to prevent the clip units 15 from unlocking which may lead to the expansion card 11 becoming loose in the slot 13.

In one embodiment, an elastic cushion 433 is disposed between the side fastening unit 43 and the slot 13 and/or the clip unit 15, and the elastic cushion 433 is, for example, a rubber pad or foam to prevent loosening of the clip unit 15 due to vibrations.

During the installation of the fastening device 40, the first top pressing unit 41 and the side fastening unit 43 connected thereto are first disposed on the expansion card 11, the slot 13, and/or the clip unit 15, and then the second top pressing unit 42 and the side fastening unit 43 connected thereto are disposed. For example, the second top pressing unit 42 is inserted into the accommodating space 412 of the first top pressing unit 41 and moved along the accommodating space 412 and the connect groove 414 in a direction towards the side fastening unit 43 connected to the first top pressing unit 41 so as to sleeve the opening 431 of the side fastening unit 43 connected to the second top pressing unit 42 over the press portion 153 of the clip unit 15. The openings 431 of the side fastening units 43 that are connected to the first top pressing unit 41 and the second top pressing unit 42 are respectively sleeved over the two clip units 15 and press and fasten the clip units 15 at the two sides of the slot 13.

Then, the fastening screw 451 is passed through the connect groove 414 of the first top pressing unit 41 and fastened to the connect hole 424 of the second top pressing unit 42, such that the first top pressing unit 41 and the second top pressing unit 42 press the expansion card 11 inserted in the slot 13 and the two side fastening units 43 press the clip units 15 to secure the connection between the expansion card 11 and the slot 13. In different embodiments, the second top pressing unit 42 and the side fastening unit 43 connected thereto are disposed first and then the first top pressing unit 41 and the side fastening unit 43 connected thereto are disposed.

Figure 6:
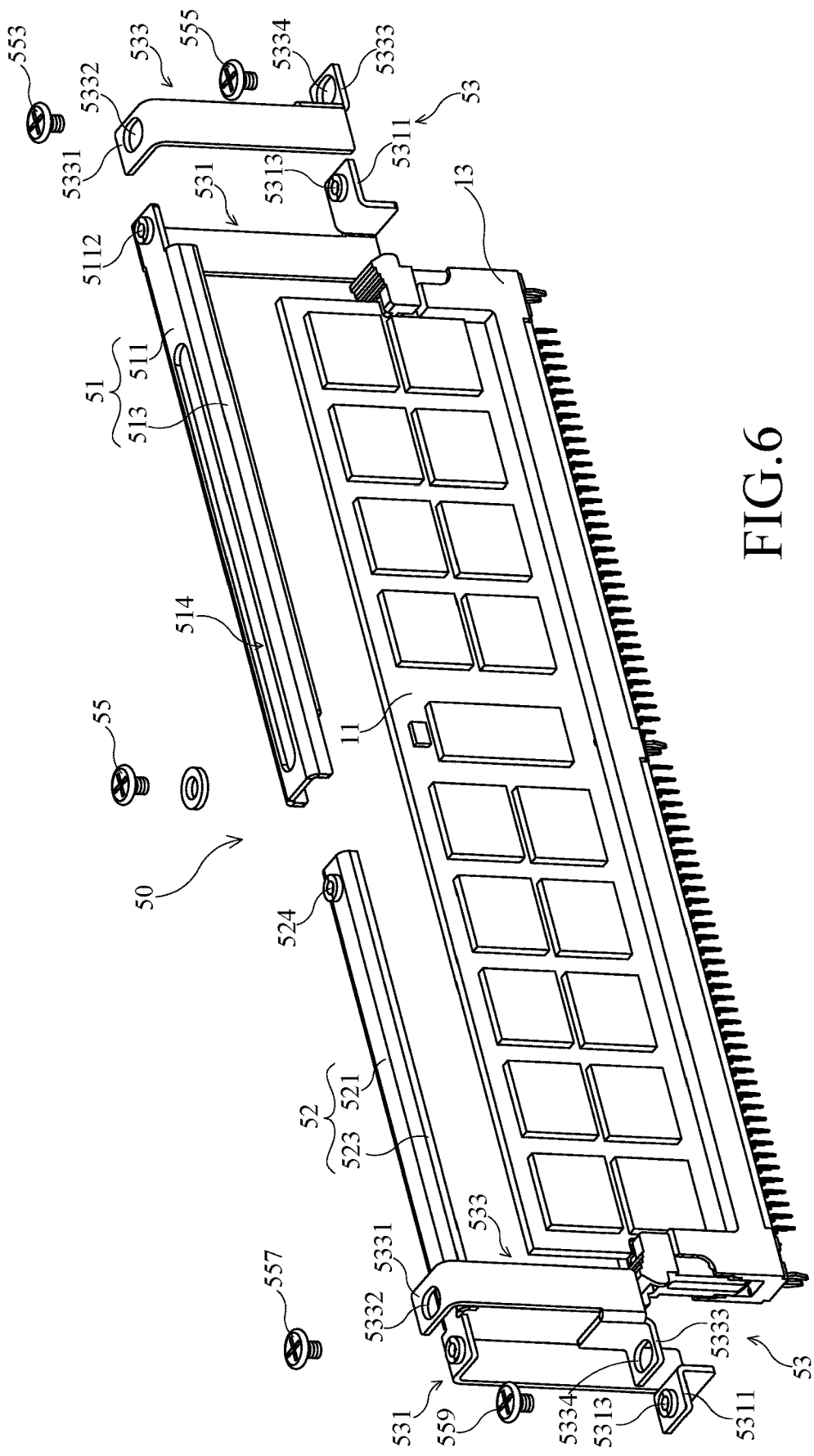
FIG. 6 is an exploded view of a fastening device for expansion cards with a memory card in a slot according to yet another embodiment of the present disclosure.
Figure 7:
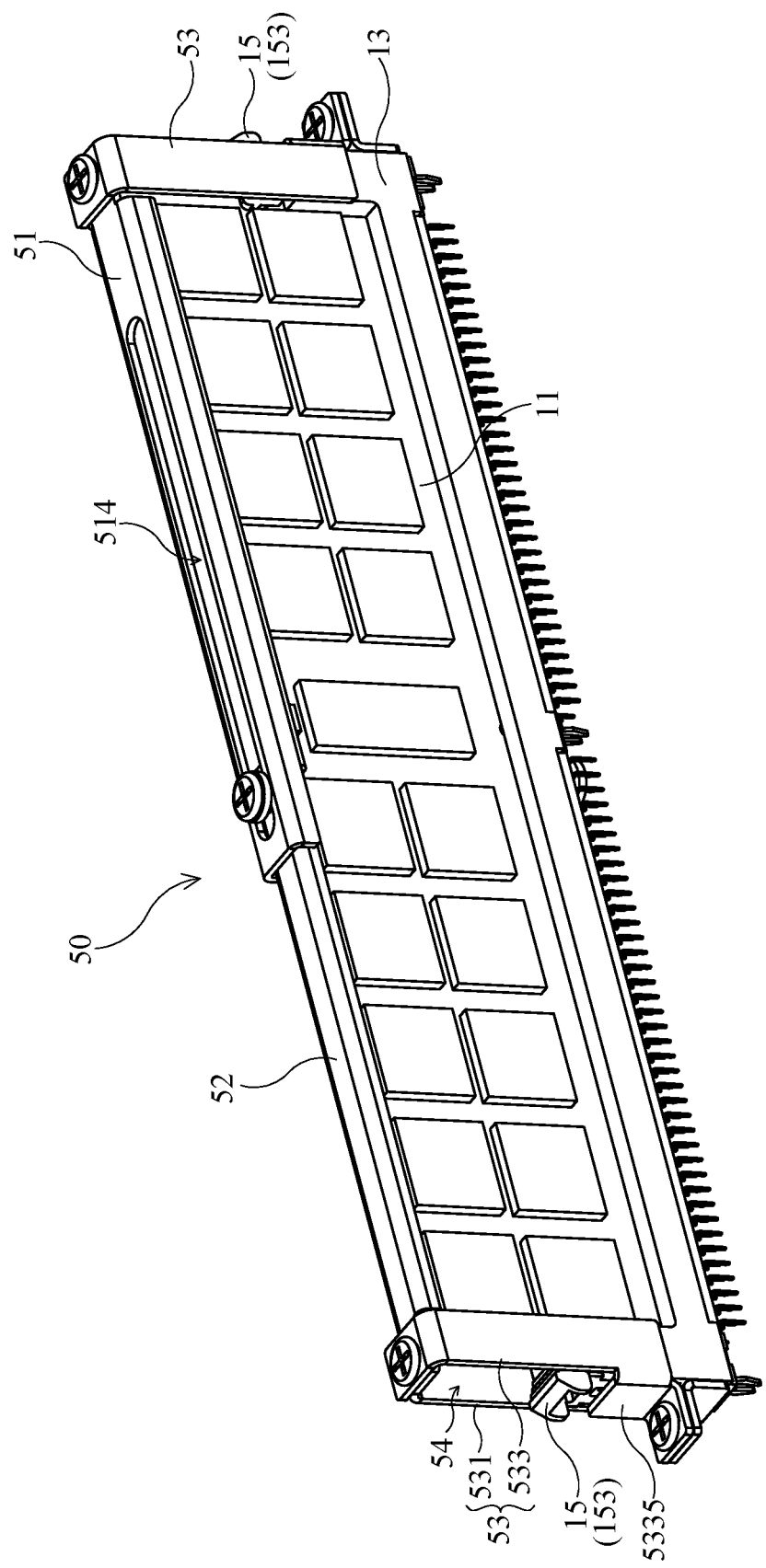
FIG. 7 is a schematic diagram of a fastening device for expansion cards assembled to a memory card and a slot according to yet another embodiment of the present disclosure.

Referring to FIGS. 6 and 7, a fastening device 50 for expansion cards according to yet another embodiment of the present disclosure includes a first top pressing unit 51, a second top pressing unit 52, and two side fastening units 53, wherein one end of the first top pressing unit 51 is connected to one end of the second top pressing unit 52. The other end of the first top pressing unit 51 is connected to one of the two side fastening unit 53 and the other end of the second top pressing unit 52 is connected to the other one of the two side fastening unit 53.

The first top pressing unit 51 includes a top board 511 and two side boards 513, wherein the top board 511 and the two side boards 513 are rectangular, and the two side boards are connected to two long side edges of the top board 511 so that the first top pressing unit 51 is U-shaped in cross-section. In addition, the second top pressing unit 52 includes a top board 521 and two side boards 523 and the cross-section or shape of the second top pressing unit 52 is similar to that of the first top pressing unit 51.

A connect groove 514 is disposed on the top board 511 of the first top pressing unit 51, wherein the connect groove 514 is strip-shaped, penetrates the top board 511 of the first top pressing unit 51, and is disposed along the long side of the top board 511.

A connect hole 524 is disposed on the top board 521 of the second top pressing unit 52, wherein a fastening screw 55 is passed through the connect groove 514 of the first top pressing unit 51 and fastens to the connect hole 524 of the second top pressing unit 52 to connect the first top pressing unit 51 and the second top pressing unit 52 and to fix the distance between the side fastening unit 53 connected to the first top pressing unit 51 and the side fastening unit 53 connected to the second top pressing unit 52.

In one embodiment, the side fastening unit 53 includes a first side fastening component 531 and a second side fastening component 533, wherein one end of the first side fastening component 531 is connected to one end of the first top pressing unit 51, and the other end of the first side fastening component 531 has a connect portion 5311 disposed thereon. For example, the first side fastening component 531 is a board-like element and is approximately perpendicular to the top board 511 of the first top pressing unit 51 and parallel to the side boards 513 of the first top pressing unit 51, and the connect portion 5311 is another board-like element that is approximately perpendicular to the first side fastening component 531 and parallel to the top board 511, wherein a through hole 5313 is disposed on the connect portion 5311.

In specific, the connect portion 5311 is an L-shaped board and includes two perpendicular planes, wherein one plane is connected to the first side fastening component 531 and the through hole 5313 is disposed on another plane.

A first connect portion 5331 is disposed at one end of the second side fastening component 533, and a second connect portion 5333 is disposed at the other end of the second side fastening component 533, wherein the second side fastening component 533 is a board-like element, and the first connect portion 5331 and the second connect portion 5333 are also board-like elements that are approximately perpendicular to the first side fastening component 531. The second side fastening component 533 is connected to the first top pressing unit 51 via the first connect portion 5331, and to the connect portion 5311 of the first side fastening component 531 via the second connect portion 5333. For example, the second connect portion 5333 is an L-shaped board and includes two perpendicular planes, wherein one plane is connected to the second side fastening component 533 and the through hole 5334 is disposed on the other plane.

In practice, the first connect portion 5331 of the second side fastening component 533 overlaps the top board 511 of the first top pressing unit 51 so that a through hole 5332 on the first connect portion 5331 aligns with a through hole 5112 on the top board 511, and a fastening screw 553 is passed through the through hole 5332 of the first connect portion 5331 and fastened to the through hole 5112 of the first top pressing unit 51. Moreover, the second connect portion 5333 of the second side fastening component 533 overlaps the connect portion 5311 of the first side fastening component 531 so that the through hole 5334 on the second connect portion 5333 aligns with a through hole 5313 on the connect portion 5311, and a fastening screw 555 is passed through the through hole 5334 of the second connect portion 5333 and fastened to the through hole 5313 of the first side fastening component 531. Hence, the second side fastening component 533 is fastened to the first top pressing unit 51 and the first side fastening component 531.

The other end of the second top pressing unit 52 can also be connected to a first side fastening component 531 and a second side fastening component 533, and the second side fastening component 533, the first side fastening component 531, and the second top pressing unit 52 can be connected via fastening screws 557, 559.

During the installation of the fastening device 50, the second top pressing unit 52 and the first side fastening component 531 connected thereto are disposed on the expansion card 11 and the slot 13 first, and then the second side fastening component 533 is connected to the second top pressing unit 52 and the first side fastening component 531. Subsequently, the first top pressing unit 51 and the first side fastening component 531 connected thereto is disposed on the expansion card and the slot 13. For example, the connect groove 414 of the first top pressing unit 51 is aligned with the connect hole 524 of the second top pressing unit 52 and the length of the first top pressing unit 51 and the second top pressing unit 52 is adjusted to change the distance between the two side fastening units 53 connected to the first top pressing unit 51 and the second top pressing unit 52 before fastening the first top pressing unit 51 and the second top pressing unit 52 with the fastening screw 55. Lastly, the second side fastening component 533 is connected to the first top pressing unit 51 and the first side fastening component 531 and thus the installation of the fastening device for expansion cards 50 is complete as shown in FIG. 7.

In one embodiment, an opening 54 is formed on each of the side fastening units 53 that are connected to the first top pressing unit 51 and the second top pressing unit 52, and the clip unit 15 and/or the press portion 153 passes through the opening 54. In specific, the first side fastening component 531 and the second side fastening component 533 clamp the two surfaces of the slot 13, like the front surface and the back surface, so as to fasten the fastening device 50 to the slot 13 and fasten the expansion card 11 in the slot 13 to prevent the expansion card 11 from becoming loose in the slot 13 due to vibrations.

In one embodiment, a block portion 5335 is disposed on the first side fastening component 531 and/or the second side fastening component 533, and the opening 54 is formed between the first side fastening component 531, the second side fastening component 533, and the block portion 5335. The block portion 5335 is, for example, a board-like element that is parallel to and in close proximity to the outer surface 1333 of the side portion 133 of the slot 13. When the first side fastening component 531 and the second side fastening component 533 are disposed on the slot 13, the block portion 5335 blocks the lower side/surface of the clip unit 15 and/or the press portion 153 to further prevent the unlocking of the clip unit 15.

Figure 9:
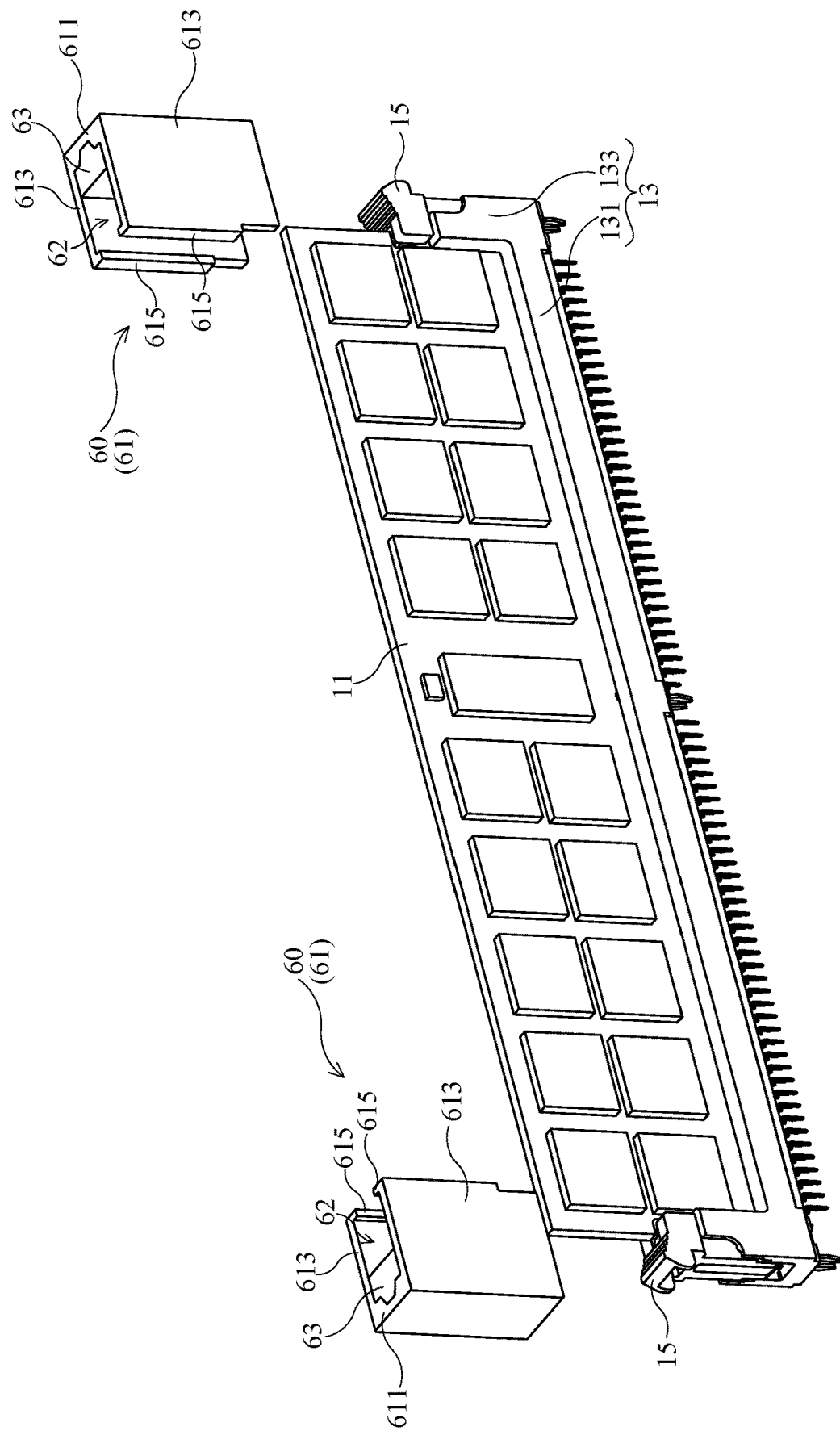
FIG. 9 is an exploded view of a fastening device for expansion cards with a memory card in a slot according to yet another embodiment of the present disclosure.
Figure 10:
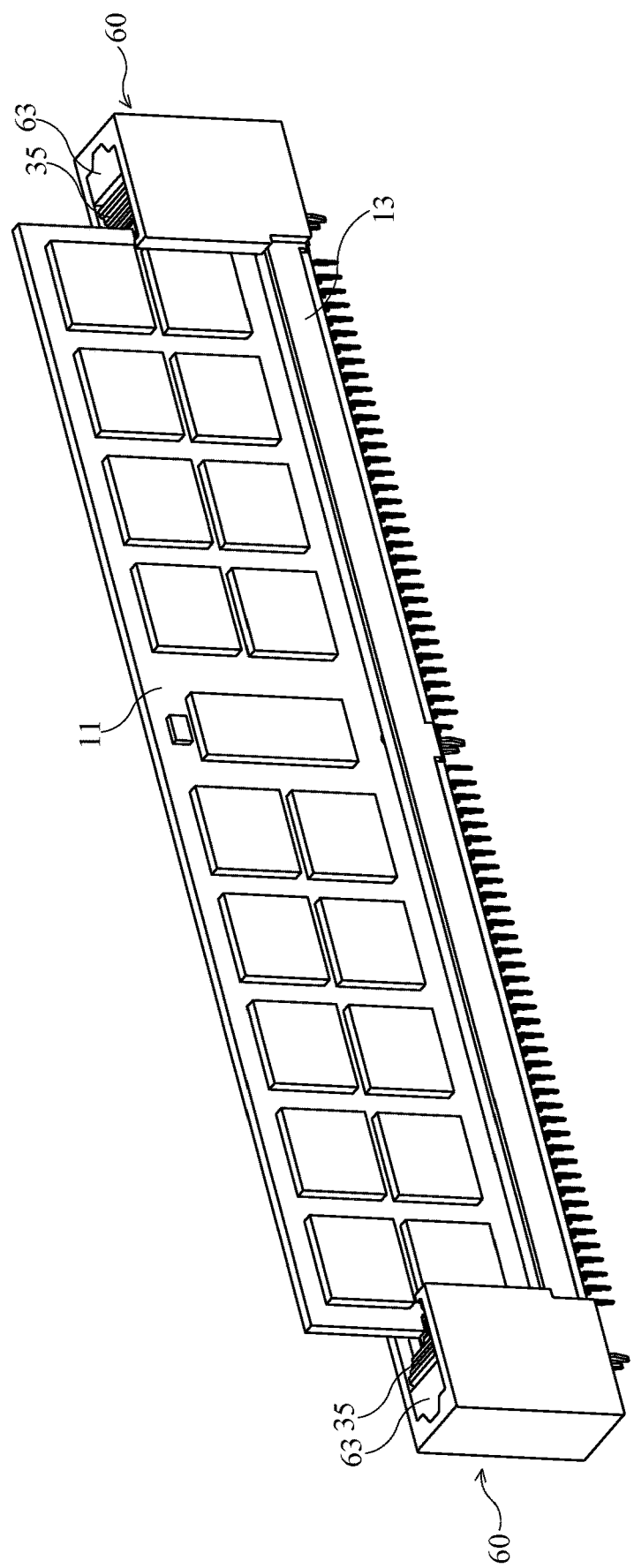
FIG. 10 is a schematic diagram of a fastening device for expansion cards assembled to a memory card and a slot according to yet another embodiment of the present disclosure.

Referring to FIGS. 9 and 10, a fastening device 60 for expansion cards according to yet another embodiment of the present disclosure includes a main body 61 and an elastic cushion 63, wherein the main body 61 includes an accommodating space 62 and the elastic cushion 63 is disposed in the accommodating space 62 of the main body 61. For example, the main body 61 is a cuboid and the accommodating space 62 is also approximately rectangular.

The main body 61 includes a fastening board 611, two connect boards 613, and two protrusions 615, wherein the two connect boards 613 are respectively connected to two opposite side edges of the fastening board 611 and the accommodating space 62 is formed between the fastening board 611 and the two connect boards 613. For example, the fastening board 611 is approximately perpendicular to the connect boards 613 and so the main body 61 is approximately U-shaped in cross-section. The elastic cushion 63 is disposed on the surface of the fastening board 611 and parts of the surfaces of the two connect boards 613.

Furthermore, while one side edge of each of the two connect boards 613 is connected to the fastening board 611, a protrusion 615 is disposed at the other side edge of the two connect boards 613 and the two protrusions protrude from the two connect boards in opposite directions. The two protrusions 615 at the two connect boards 613 face each other and thus a fastening mechanism is formed by the protrusions 615. For example, the protrusion 615 is strip-shaped and approximately perpendicular to the connect board 613 to form a skid-rail mechanism on the two connect boards 613. Referring to the connect board 613 on the right-hand side of the fastening device 60 in FIG. 9, the right side of the connect board 613 is connected to the fastening board 611 and the left side of the connect board 613 is connected to the protrusion 615.

Generally, the slot 13 on the motherboard of the computer includes a base 131 and two side portions 133, wherein the base 131 is a strip and the two side portions 133 are respectively connected to two ends of the base 131 and are perpendicular to the base 131 so that the slot 13 is approximately U-shaped. Moreover, an accommodation groove 12 is provided on the inner surface 1311 of the base 131 and the inner surface 1331 of the side portion 133, and a clip unit 15 is disposed on the outer surface 1333 of each of the two side portions 133 as shown in FIG. 8. In practice, the expansion card 11 is inserted into the accommodating space 12 and secured by the clip units 15.

The main body 61 of the fastening device for expansion cards 60 is sleeved over the side portion 133 of the slot 13 and/or the clip unit 15 to place the side portion 133 and/or the clip unit 15 inside the accommodating space 62, wherein the protrusions 615 connected to the two connect boards 613 engage the inner surface 1331 of the side portion 133 and are positioned respectively on two sides of the expansion card 11, and the elastic cushion 63 is squeezed and deformed to compress the clip unit 15. Therefore, when the fastening device for expansion cards 60 is disposed on the side portion 133 of the slot 13, the clip unit 15 of the slot 15 is held in place and the loosening of the clip unit 15 from the expansion card 11 is prevented.

The above disclosure is only the preferred embodiment of the present disclosure, and not used for limiting the scope of the present disclosure. All equivalent variations and modifications on the basis of shapes, structures, features and spirits described in claims of the present disclosure should be included in the claims of the present disclosure.

What is claimed is:

1. A fastening device for fastening an expansion card in a slot, wherein the slot comprises a clip unit disposed at each of two ends of the slot for clipping two side edges of the expansion card inserted in the slot, the device comprising:
   a top pressing unit;
   two side fastening units connected respectively to two ends of the top pressing unit, each of the two side fastening units comprising an opening, wherein the two side fastening units press and fasten the two clip units respectively when the two clip units at the two ends of the slot respectively pass through the openings of the two side fastening units, wherein the top pressing unit comprises a first top pressing unit and a second top pressing unit, one end of the first top pressing unit is connected to one end of the second top pressing unit, the other end of the first top pressing unit is connected to one of the two side fastening units, and the other end of the second top pressing unit is connected to the other one of the two side fastening units; and
   two elastic cushions respectively disposed between the two side fastening units and the two clip units.

2. The fastening device of claim 1, wherein the first top pressing unit comprises an accommodating space for accommodating the second top pressing unit, and the second top pressing unit is movable in the accommodating space relative to the first top pressing unit to adjust a distance between the two side fastening units that are connected to the first top pressing unit and the second top pressing unit.

3. The fastening device of claim 2, wherein the first top pressing unit further comprises a connect groove, the second top pressing unit comprises a connect hole, and a fastening screw passes through the connect groove of the first top pressing unit and connects with the connect hole of the second top pressing unit to connect the first top pressing unit and the second top pressing unit and to fix the distance between the two side fastening units that are connected to the first top pressing unit and the second top pressing unit.

4. The fastening device of claim 1, wherein the side fastening unit comprises a bend at one end thereof and the bend bends in a direction away from the slot.

5. A fastening device for fastening an expansion card in a slot, wherein the slot comprises a clip unit disposed at each of two ends of the slot for clipping two side edges of the expansion card inserted in the slot, the device comprising:
   a top pressing unit; and
   two side fastening units connected respectively to two ends of the top pressing unit, each of the two side fastening units comprising an opening, wherein the two side fastening units press and fasten the two clip units respectively when the two clip units at the two ends of the slot respectively pass through the openings of the two side fastening units;
   wherein the top pressing unit comprises a first top pressing unit and a second top pressing unit, one end of the first top pressing unit is connected to one end of the second top pressing unit, the other end of the first top pressing unit is connected to one of the two side fastening units, and the other end of the second top pressing unit is connected to the other one of the two side fastening units;
   wherein the side fastening unit comprises a first side fastening component and a second side fastening component;
   wherein the first side fastening component and the second side fastening component clamp two opposite surfaces of the slot.

6. The fastening device of claim 5, wherein the first side fastening component or the second side fastening component comprises a block portion for blocking the clip unit, and the opening is located between the first side fastening component, the second side fastening component, and the block portion.

7. The fastening device of claim 5, wherein the second side fastening component is connected to the first side fastening component and the first top pressing unit or the second top pressing unit via a fastening screw.

8. A fastening device for fastening an expansion card in a slot, wherein the slot comprises two clip units, a base and two side portions connected respectively to two ends of the base, each of the two side portions comprises an outer surface and an inner surface, and the two clip units are disposed respectively on the outer surfaces of the two side portions for clipping two side edges of the expansion card inserted into the slot, the device comprising:
   a main body comprising:
   a fastening board;
   two connect boards connected respectively to two opposite side edges of the fastening board, wherein an accommodating space is formed between the fastening board and the two connect boards;
   two protrusions disposed respectively on the two connect boards, wherein the two protrusions face each other and protrude from the two connect boards in opposite directions, wherein one side edge of each of the connect boards is connected to the fastening board, and the other side edge of each of the connect boards is connected to the protrusion; and
   an elastic cushion disposed in the accommodating space of the main body, wherein the protrusions engage the inner surface of the side portion and the elastic cushion compresses the clip unit on the outer surface of the side portion when the main body sleeves over the side portion and the clip unit of the slot to place the side portion and the clip unit inside the accommodating space of the main body.

9. The fastening device of claim 8, wherein the two protrusions on the two connect boards are respectively positioned on two sides of the expansion card.

* * * * *